(12) United States Patent
Ohno

(10) Patent No.: US 8,311,664 B2
(45) Date of Patent: Nov. 13, 2012

(54) TRAY SUPPLY APPARATUS

(75) Inventor: Katsuhiko Ohno, Kanagawa (JP)

(73) Assignee: Sony Corporation, Tokyo (JP)

( * ) Notice: Subject to any disclaimer, the term of this patent is extended or adjusted under 35 U.S.C. 154(b) by 219 days.

(21) Appl. No.: 12/730,667

(22) Filed: Mar. 24, 2010

(65) Prior Publication Data
US 2010/0256801 A1 Oct. 7, 2010

(30) Foreign Application Priority Data
Apr. 6, 2009 (JP) ................................ 2009-091713

(51) Int. Cl.
*B65G 49/00* (2006.01)
*B65G 59/02* (2006.01)
*G06F 7/00* (2006.01)

(52) U.S. Cl. ........................ 700/218; 414/277; 414/400
(58) Field of Classification Search .................... 700/218
See application file for complete search history.

(56) References Cited

U.S. PATENT DOCUMENTS

| | | | |
|---|---|---|---|
| 4,032,027 A * | 6/1977 | Lindberg | 414/400 |
| 5,380,138 A * | 1/1995 | Kasai et al. | 414/277 |
| 5,868,545 A * | 2/1999 | Kasai et al. | 414/808 |
| 6,036,425 A * | 3/2000 | Seto | 414/277 |
| 6,199,272 B1 * | 3/2001 | Seto et al. | 29/740 |
| 6,427,320 B1 * | 8/2002 | Seto et al. | 29/740 |
| 7,540,367 B2 * | 6/2009 | Terui et al. | 198/347.1 |
| 2006/0169412 A1 * | 8/2006 | Terui et al. | 156/349 |
| 2006/0200975 A1 * | 9/2006 | Hata et al. | 29/743 |

FOREIGN PATENT DOCUMENTS
JP 2808646 7/1998
JP 3711689 8/2005
* cited by examiner

*Primary Examiner* — Gene Crawford
*Assistant Examiner* — Kyle Logan
(74) *Attorney, Agent, or Firm* — SNR Denton US LLP

(57) ABSTRACT

A tray supply apparatus includes a tray magazine, a sub magazine, a supply station, and a lifting and lowering mechanism. The tray magazine can store a tray on each of a plurality of stages. The tray stores components. The sub magazine includes a plurality of conveyance mechanisms having a plurality of stages. The sub magazine is adjacent to the tray magazine and capable of taking out the tray from the tray magazine. The supply station includes a plurality of placement portions having a plurality of stages, on each of which the tray is placed, and a stage that lifts and lowers the tray between the plurality of placement portions. The supply station is disposed at a position where the components are picked up. The lifting and lowering mechanism lifts and lowers the sub magazine to convey the tray between the tray magazine and the supply station through the sub magazine.

8 Claims, 14 Drawing Sheets

TRAY SUPPLY APPARATUS

BACKGROUND OF THE INVENTION

1. Field of the Invention

The present invention relates to a tray supply apparatus that supplies a tray, in which a plurality of electronic components or a plurality of other components are stored, to a component pickup position in a component mounting apparatus, for example.

2. Description of the Related Art

In related art, there has been proposed an apparatus that supplies a tray in which a plurality of electronic components are stored to a component pickup position in a component mounting apparatus. An apparatus A disclosed in Japanese Patent No. 2808646 (hereinafter, referred to as Patent Document 1) includes a magazine apparatus B in which trays are layered and stored and a table apparatus C that pulls out one tray 3 from the magazine apparatus B. The table apparatus C has a function of taking out a component from the tray and mounting the component taken out on a sub stage D at a pickup position of the component in the component mounting apparatus (see, FIGS. 1 and 2 of Patent Document 1).

On the other hand, in an apparatus disclosed in Japanese Patent No. 3711689 (hereinafter, referred to as Patent Document 2), two trays 14 pulled out from a magazine 10 are brought into a standby state at a first standby stage S11 and a second standby stage S21 that are vertically arranged in two stages (see, FIGS. 4 to 11 of Patent Document 2).

SUMMARY OF THE INVENTION

Incidentally, there are demands in the industrial field for the increase in number of trays that can be supplied by a tray supply apparatus to a component mounting apparatus per unit time, that is, the improvement of time efficiency of the supply of trays.

In view of the above-mentioned circumstances, it is desirable to provide a tray supply apparatus capable of performing time-efficient supplying of trays to a component mounting apparatus.

According to an embodiment of the present invention, there is provided a tray supply apparatus including a tray magazine, a sub magazine, a supply station, and a lifting and lowering mechanism.

The tray magazine is capable of storing a tray on each of a plurality of stages, and the tray stores components.

The sub magazine includes a plurality of conveyance mechanisms having a plurality of stages. The sub magazine is adjacent to the tray magazine and is capable of taking out the tray from the tray magazine. The plurality of conveyance mechanisms each convey the tray.

The supply station includes a plurality of placement portions having a plurality of stages, on each of which the tray is placed, and a stage that lifts and lowers the tray between the plurality of placement portions. The supply station is disposed at a position where the components stored in the tray are picked up.

The lifting and lowering mechanism lifts and lowers the sub magazine to convey the tray between the tray magazine and the supply station through the sub magazine.

The supply station includes a stage that lifts and lowers a tray between the plurality of placement portions, and the tray can be moved between the placement portions. That is, the drives of the lifting and lowering stage and the lifting and lowering mechanism are appropriately controlled so that a time-efficient conveyance path is set in the case where the tray is conveyed through the tray magazine, the conveyance mechanism, and the placement portion. As a result, the time efficiency of the supply of the tray can be increased.

The tray supply apparatus further includes a control means for controlling drive of the lifting and lowering mechanism so that a height of at least one of the plurality of conveyance mechanisms is set to be equal to a height of at least one of the plurality of placement portions.

One of an interval of the plurality of placement portions and a storing interval for the trays of the tray magazine is set to an integer multiple of an interval of the plurality of conveyance mechanisms.

With this structure, it is possible to convey the trays between the plurality of conveyance mechanisms and the plurality of placement portions substantially at the same time, with the result that the time efficiency of the supply of the tray can be increased.

The tray supply apparatus further includes a conveyance control means for controlling drives of first and second conveyance mechanisms out of the plurality of conveyance mechanisms so that a time period during which the tray is moved from a first placement portion out of the plurality of placement portions to the sub magazine by the first conveyance mechanism is overlapped with a time period during which the tray is moved from the sub magazine to a second placement portion out of the plurality of placement portions by the second conveyance mechanism, the first conveyance mechanism being positioned at a height corresponding to a height of the first placement portion.

That is, for example, during returning of the tray from the supply station to the sub magazine, the tray in which the next requisite component is stored can be conveyed from the sub magazine to the supply station. As a result, the time efficiency of the supply of the tray can be increased.

The supply station includes a placement portion movement mechanism and means for controlling the stage and the placement portion movement mechanism.

The placement portion movement mechanism moves the placement portion to cause the placement portion to place the tray and release the placement of the tray.

The means for controlling the stage and the placement portion movement mechanism controls the stage and the placement portion movement mechanism so that, when the tray is moved from a first placement portion to a second placement portion out of the plurality of placement portions, the stage is caused to support the tray, the placement portion movement mechanism is caused to release the placement of the tray on the first placement portion and place the tray on the second placement portion, and the support of the tray by the stage is released.

The conveyance mechanism is a belt conveyor unit that moves the tray placed thereon.

With this structure, it is possible to realize a miniaturized conveyance mechanism with a simpler structure as compared to another conveyance system. The placement portion may also be a belt conveyor unit that moves the tray placed thereon.

The tray supply apparatus further includes means for controlling a height of the stage in accordance with the components having different heights.

For example, even in a case where an adjustment range (generally preset) of the height of the pickup mechanism for picking up a component from the tray disposed on the supply station is relatively small, the height of the tray can be changed by the stage. As a result, the component mounting apparatus can treat a relatively large (high) component.

As described above, according to the embodiments of the present invention, the increase in size of the tray magazine can be prevented, and the trays can be supplied in a time-efficient manner.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, an embodiment of the present invention will be described with reference to the drawings.

(Structure of Tray Supply Apparatus)

Figure 1:
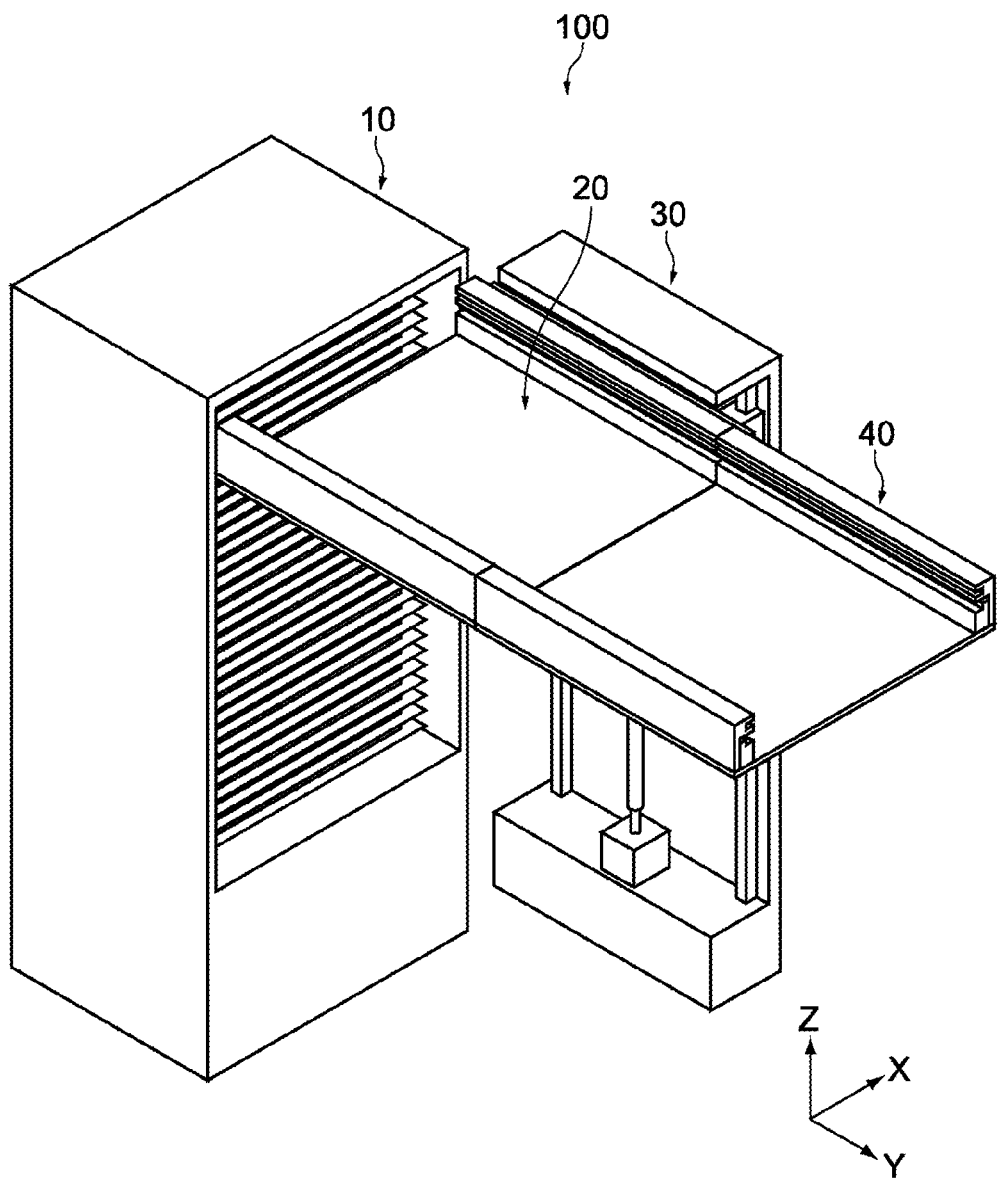
FIG. 1 is a perspective view showing a tray supply apparatus according to an embodiment of the present invention.
Figure 2:
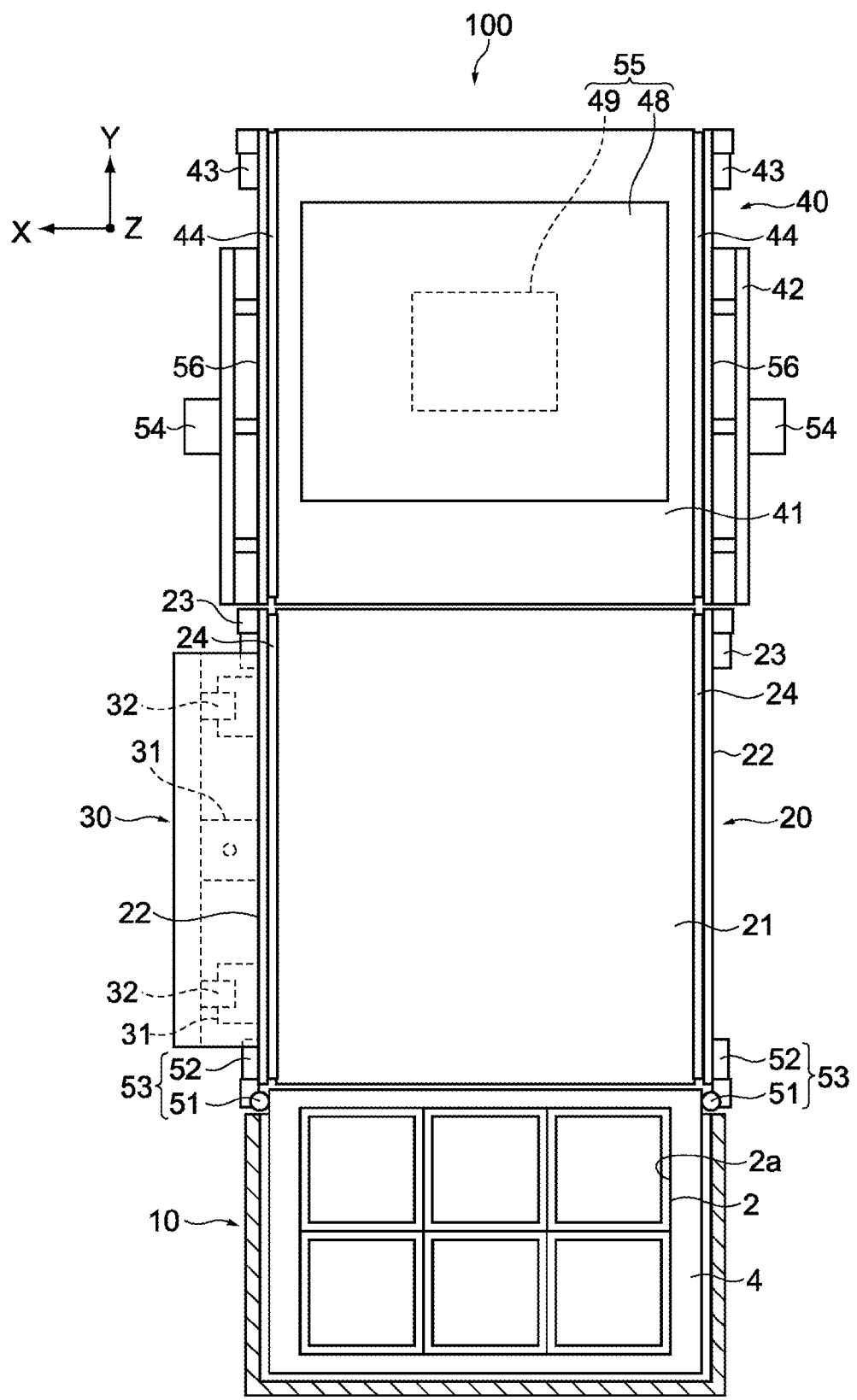
FIG. 2 is a plan view showing the tray supply apparatus.
Figure 3:
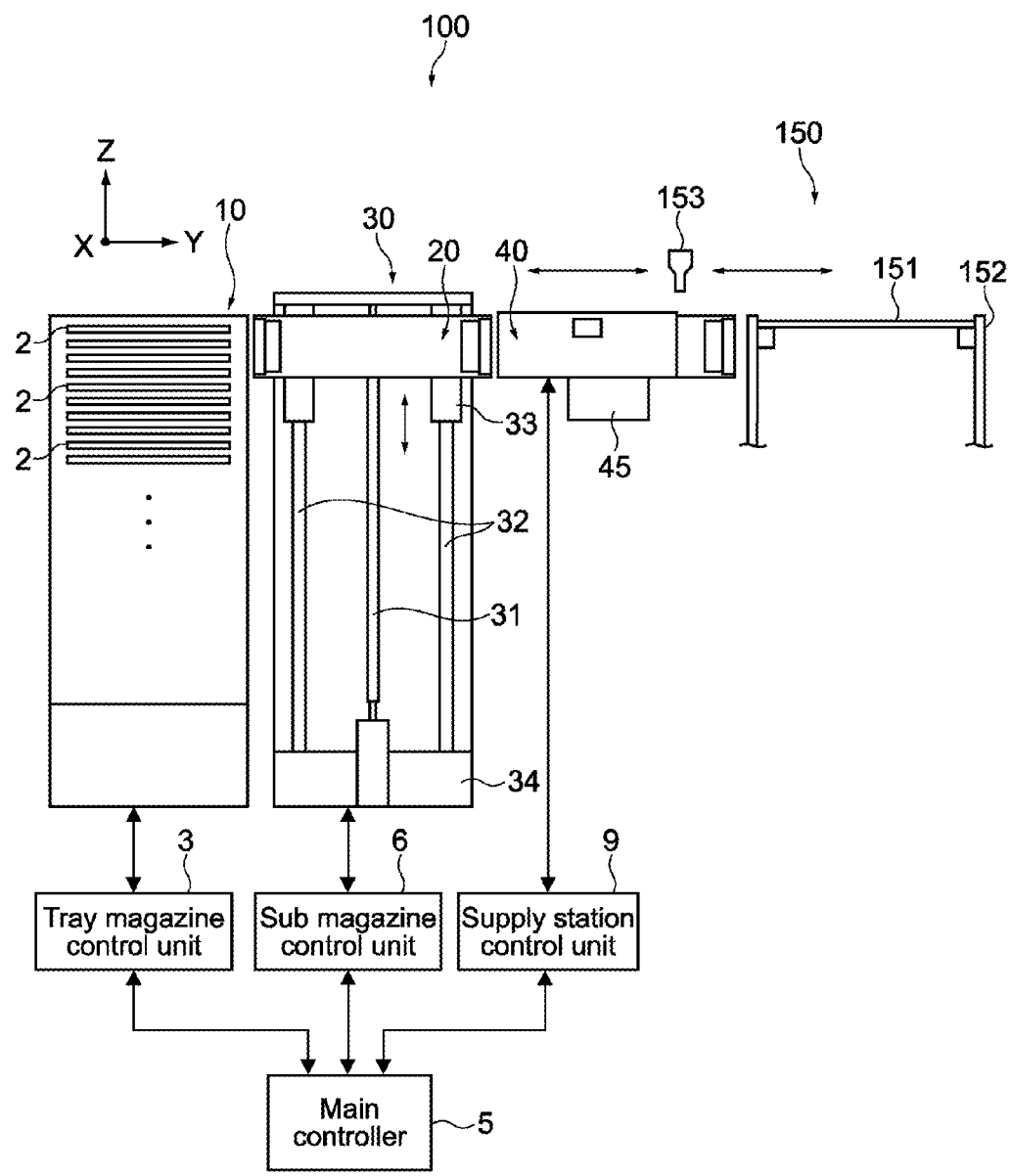
FIG. 3 is a side view showing the tray supply apparatus.
Figure 4:
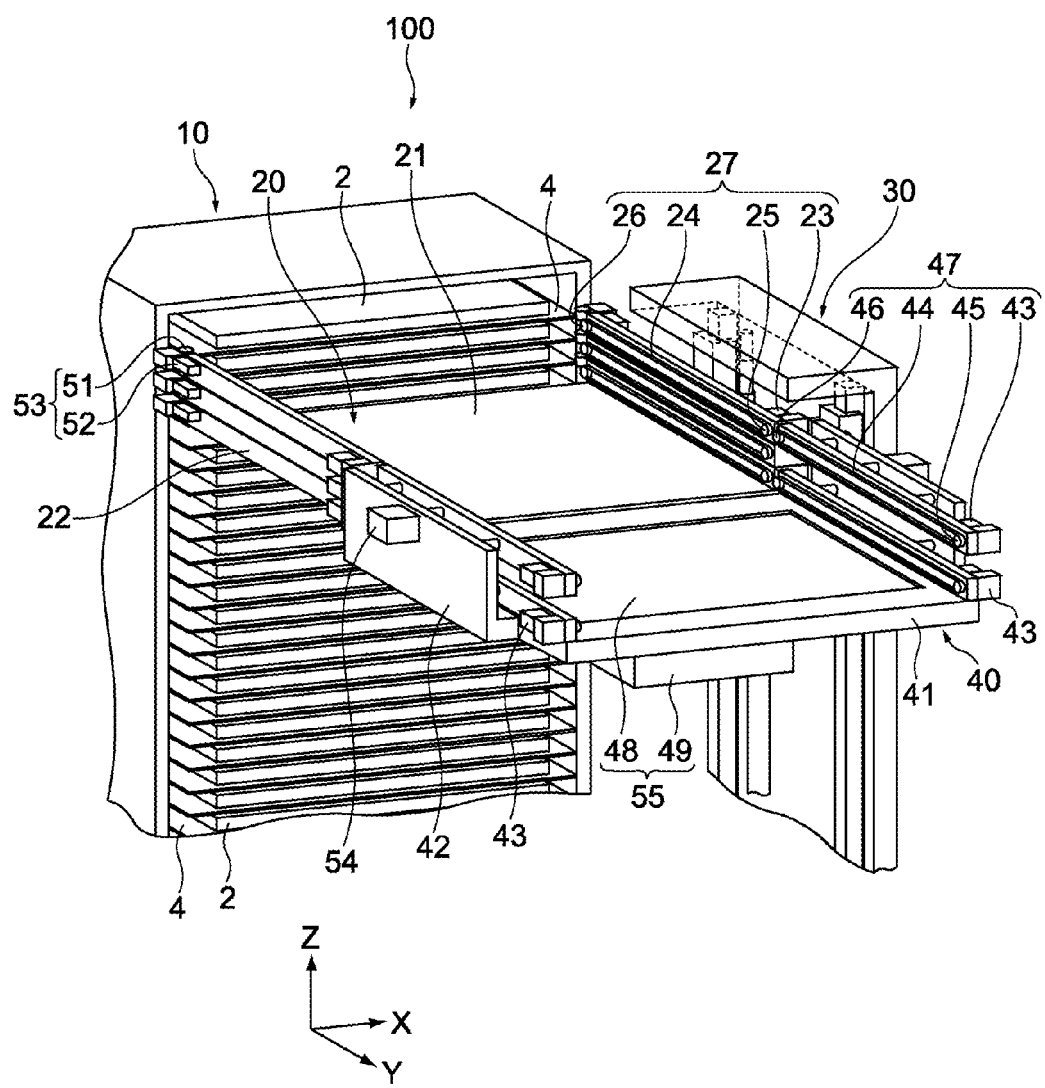
FIG. 4 is a perspective view showing main parts of the tray supply apparatus.

FIG. 1 is a perspective view showing a tray supply apparatus according to an embodiment of the present invention. FIG. 2 is a plan view showing the tray supply apparatus, and FIG. 3 is a side view thereof. FIG. 4 is a perspective view showing details of the tray supply apparatus.

A tray supply apparatus 100 includes a tray magazine 10, a sub magazine 20, a supply station 40, and a lifting and lowering mechanism 30. The tray magazine 10, the sub magazine 20, and the supply station 40 are arranged in a line in a Y direction in FIGS. 1 and 2, for example.

The tray magazine 10 is capable of storing a plurality of trays 2, in each of which electrical components P (see, FIG. 2) are stored, in a predetermined number of stages, e.g., 10 to 30 stages in a vertical direction (Z direction). Typically, one tray 2 is mounted on one palette 4. A plurality of sets of the tray 2 and the palette 4 are stored in the tray magazine 10 with the tray 2 and the palette 4 being one set. Hereinafter, the set of the tray 2 and the palette 4 is simply referred to as a "tray", as long as the palette 4 is particularly mentioned. It should be noted that the tray supply apparatus 100 may eliminate the palette 4 and use only the tray 2.

In the one tray 2, a plurality of electrical components P are stored. As shown in FIG. 2, the one tray 2 includes a plurality of pockets that are divided in a matrix pattern, for example. In one pocket, one electrical component P is stored. Typically, in the one tray 2, the plurality of electrical components P that are the same are stored. However, different electrical components P may be stored in the one tray 2. Examples of the electrical component P include an IC package, a capacitor, a resistance, a coil, a connector, and the like.

The sub magazine 20 is adjacent to the tray magazine 10 and connected to the lifting and lowering mechanism 30 so as to be lifted and lowered by the lifting and lowering mechanism 30. The sub magazine 20 includes a base plate 21, side plates 22 fixed on both sides of the base plate 21, and a plurality of belt conveyor units 27 respectively provided to the side plates 22. The belt conveyor units 27 each function as a conveyor mechanism for conveying the tray 2.

Figure 5:
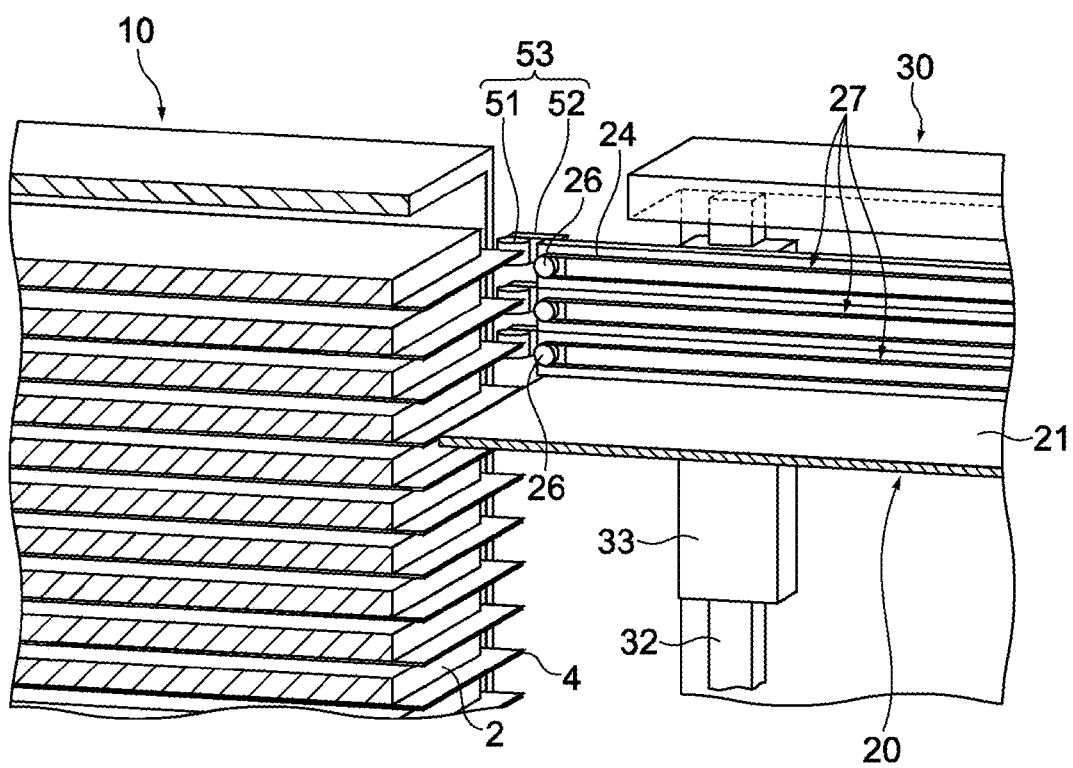
FIG. 5 is a cross-sectional perspective view showing a part of the tray supply apparatus for explaining a belt conveyor unit and a loading mechanism.

FIG. 5 is a cross-sectional perspective view of a part of the tray supply apparatus for explaining the belt conveyor units 27 and loading mechanisms 53 (described later). The belt conveyor units 27 are vertically arranged on three stages, that is, six belt conveyor units 27 are provided in total. The number of stages may be two or may be four or more. In this embodiment, the number of the belt conveyor units 27 is set to be smaller than the number of stages of the tray magazine 10 on which the trays 2 can be stored (for example, 10 to 30 stages as described above). The six belt conveyor units 27 substantially have the same structure. Two belt conveyor units 27 provided at the same height on both sides of the sub magazine 20 convey one tray 2.

Hereinafter, one belt conveyor unit 27 will be described. As shown in FIG. 4, the belt conveyor unit 27 includes a conveyance motor 23, a drive pulley 25, a follower pulley 26, and an endless belt 24. The drive pulley 25 is driven by the conveyance motor 23. The endless belt 24 is extended between the drive pulley 25 and the follower pulley 26. For example, the conveyance motor 23 is attached to the side plate 22, and the drive pulley 25 and the follower pulley 26 are rotatably connected to the side plate 22.

The two belt conveyor units 27 provided at the same height are distanced so that the palette 4 is placed on the two endless belts 24.

In this embodiment, the belt conveyor units 27 are used, thereby making it possible to realize a miniaturized conveyance mechanism with a simpler structure as compared to another conveyance system.

On an end of each of the side plates 22 of the sub magazine 20, on the side on which the tray magazine 10 is provided, the loading mechanism 53 is provided. The loading mechanism 53 pulls out the tray 2 stored in the tray magazine 10 and loads the tray 2 into the sub magazine 20, and unloads it from the sub magazine 20 to the tray magazine 10.

FIG. 5 partially shows the perspective cross-sectional view for explaining the loading mechanism 53. The loading mechanism 53 is provided for each of the belt conveyor units 27. The loading mechanism 53 includes a guide roller 51, a loading motor 52, and an opening and closing mechanism (not shown). The guide rollers 51 are rotatable around an axis in the Z direction and sandwich the palette 4 from the both sides thereof. The loading motor 52 rotates the guide roller

51. The opening and closing mechanism opens and closes the guide roller 51 in an X direction.

The opening and closing mechanism may be formed of a rack-and-pinion mechanism, a ball screw mechanism, a solenoid, or an air cylinder, for example. Alternatively, the opening and closing mechanism may be an elastic material such as a spring and rubber, which gives the palette 4 an elastic force by sandwiching the palette 4 from the both sides thereof.

Intervals in the Z direction of the belt conveyor units 27 (and the loading mechanisms 53) correspond to storing intervals, that is, intervals in the Z direction of the trays 2 stored in the tray magazine 10.

The lifting and lowering mechanism 30 lifts and lowers the sub magazine 20 to convey the tray 2 between the tray magazine 10 and the supply station 40. The lifting and lowering mechanism 30 includes a base body 34, a ball screw mechanism 31, a guide rail 32, and a movable body 33. The base body 34 is caused to stand vertically in the Z direction. The ball screw mechanism 31 and the guide rail 32 are attached to the base body 34. The movable body 33 is attached to the side plate 22 (or the base plate 21) of the sub magazine 20 and slidably connected to the guide rail 32.

The supply station 40 includes a base plate 41, side plates 42, and a lifting and lowering stage 55. The side plates 42 are fixed on both sides of the base plate 41. The lifting and lowering stage 55 is provided to the base plate 41. In addition, the supply station 40 further includes belt conveyor units 47 and an opening and closing cylinder 54. The belt conveyor units 47 serve as placement portions having multiple stages and provided to the side plates 42 through a plate member. The opening and closing cylinder 54 performs an opening and closing drive on an uppermost belt conveyor unit 47, out of the belt conveyor units 47, in a lateral direction (X direction).

The belt conveyor unit 47 may have the same structure as the belt conveyor unit 27 of the sub magazine 20. The number of belt conveyor units 47 is set to four in two stages in the Z direction. Each interval thereof in the Z direction is set to twice the intervals between the belt conveyor units 27 of the sub magazine 20.

The lifting and lowering stage 55 includes a stage plate 48 and a lifting and lowering motor 49. The stage plate 48 forms a part of the base plate 41, and the lifting and lowering motor 49 is provided on a lower side of the stage plate 48. The lifting and lowering stage 55 lifts and lowers the tray 2 (and the palette 4) between the belt conveyor units 47 in the two stages with the palette 4 being placed on the stage plate 48. For the lifting and lowering motor 49, a servomotor, a stepping motor, or the like is used, to lift and lower the stage plate 48 so as to be positioned within an arbitrary range between the belt conveyor units 47.

The opening and closing cylinder 54 is provided on the side plate 42. As a mechanism for opening and closing, another drive system that uses a motor may be used instead of the cylinder drive system that uses the opening and closing cylinder 54. While the uppermost belt conveyor units 47 are evacuated so as to be opened toward outside by the opening and closing cylinder 54, the lifting and lowering stage 55 lifts (or lowers) the tray 2.

It should be noted that, in FIG. 1, the mechanism of the loading mechanism 53, the belt conveyor units 27, the opening and closing cylinder 54, and the like are simplified or omitted, and the same holds true for descriptions on operations with reference to FIGS. 6 to 8.

For example, the base plate 41 is supported by a support body (not shown) from the bottom thereof, thereby disposing the supply station 40 at a predetermined height. The height of the supply station 40 is typically set as follows. That is, the height of the tray 2 placed on the uppermost belt conveyor unit 47 of the supply station 40 is set to be the same as the height of the tray 2 stored in the uppermost stage of the tray magazine 10.

A distance between the tray magazine 10 and the sub magazine 20 is set as appropriate so that the trays 2 can be conveyed therebetween by the loading mechanisms 53 and the belt conveyor units 27. In the same way, a distance between the sub magazine 20 and the supply station 40 is set as appropriate so that the trays 2 can be conveyed therebetween by the belt conveyor units 27 and 47.

As shown in FIG. 3, typically, the supply station 40 is disposed at a position where the electronic component P stored in the tray 2 is picked up by a suction head 153 of a component mounting apparatus 150 that sucks the electronic component P. In FIG. 3, a part of the component mounting apparatus 150 is shown. The component mounting apparatus 150 includes the suction head 153 and a conveyor 152. The suction head 153 is movable in the Z and Y directions. The conveyor 152 conveys a printed circuit board 151 as a target on which the electronic component P is mounted. In FIG. 3, the conveyor 152 conveys the printed circuit board 151 in a direction vertical to the plane of FIG. 3. The suction head 153 picks up the electronic component P from the tray 2 on the supply station 40 and mounts the electronic component P on the printed circuit board 151 on the conveyor 152.

In addition, the tray supply apparatus 100 is provided with a main controller 5, a tray magazine control unit 3, a sub magazine control unit 6, and a supply station control unit 9.

The tray magazine control unit 3 stores identification numbers of the trays 2 in the tray magazine 10 and manages the trays 2 and the like that are stored in the tray magazine 10 or that are taken out from the tray magazine 10. In addition, the tray magazine control unit 3 manages a stock status and the like of the electrical components P based on the identification numbers of the trays 2.

The sub magazine control unit 6 controls the drives of the lifting and lowering mechanism 30, the loading mechanisms 53, the belt conveyor units 27 (conveyance motors 23), and the like. The loading mechanisms 53 and the conveyance motors 23 are separately driven.

The supply station control unit 9 controls the drives of the belt conveyor units 27 and 47 (conveyance motors 23 and 43), the opening and closing cylinder 54, the lifting and lowering stage 55, and the like. The conveyance motors 23 and 43 are separately driven. But, the two conveyance motors 23 (and the two conveyance motors 43) positioned at the same height may be driven based on a common drive signal.

The main controller 5 performs overall control on the tray magazine control unit 3, the sub magazine control unit 6, and the supply station control unit 9.

The main controller 5 and the control units 3, 6, and 9 are implemented with hardware or with both of hardware and software. Examples of the hardware that implements the controller and the control units include a CPU (central processing unit), an MPU (micro processing unit), a RAM (random access memory), a ROM (read only memory), a DSP (digital signal processor), an FPGA (field programmable gate array), and the like.

It should be noted that the main controller 5 may be the same controller that performs the overall control on the component mounting apparatus 150 or may be a different controller.

(Operations of Tray Supply Apparatus 100)

Figure 6A:
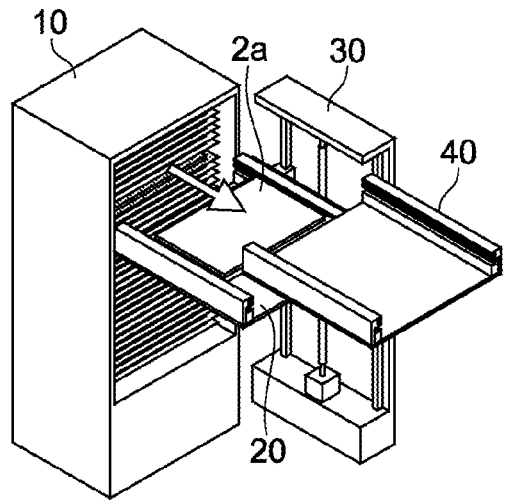
FIG. 6 are perspective views showing operations of the tray supply apparatus in sequence.

FIGS. 6 to 8 are perspective views showing operations of the tray supply apparatus 100 in sequence. As shown in FIG. 6A, in order to pull out a predetermined tray 2 stored in the tray magazine 10, the sub magazine 20 is driven by the lifting and lowering mechanism 30 and thus positioned to a height at which the tray 2 is stored. Specifically, the sub magazine 20 is driven so that the height of a set (pair) of the belt conveyor units 27 out of the belt conveyor units 27 of the sub magazine 20 is set to be the same as the height at which the tray 2 to be pulled out is stored in the tray magazine 10.

When the sub magazine 20 is positioned, by the drives of the loading mechanisms 53 and the belt conveyor units 27, the tray 2 is pulled out from the tray magazine 10. Hereinafter, the tray 2 that is pulled out first is referred to as a first tray 2a. When the first tray 2a is moved to a predetermined position on the base plate 21 of the sub magazine 20, the drive of the belt conveyor units 27 is stopped, and the first tray 2a is positioned at a predetermined position on the endless belt 24. In this embodiment, at the time when the first tray 2a is pulled out from the tray magazine 10, out of three sets (upper, middle, and lower stages) of belt conveyor units 27, the belt conveyor units 27 on the upper stage are used.

Figure 6B:
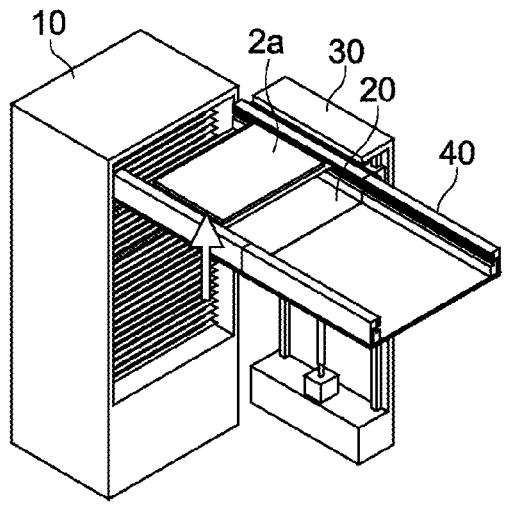

As described above, when the first tray 2a is passed to the sub magazine 20, the sub magazine 20 is positioned at the same height as the supply station 40 by the drive of the lifting and lowering mechanism 30 as shown in FIG. 6B. In this embodiment, the sub magazine 20 is positioned so that the height of the upper belt conveyor units 27 on which the first tray 2a is disposed is set to be equal to the height of the upper belt conveyor units 47 of the supply station 40.

Figure 6C:
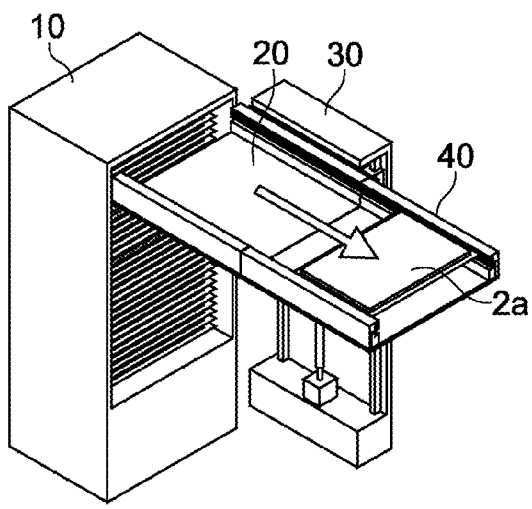

When the sub magazine 20 is positioned, the upper belt conveyor units 47 of the supply station 40 are driven. As shown in FIG. 6C, when the first tray 2a is moved to a predetermined position on the base plate 41 of the supply station 40, the drive of the belt conveyor units 47 is stopped, and the first tray 2a is positioned at a predetermined position on the endless belts 44.

As described above, in the process in which the first tray 2a is conveyed from the tray magazine 10 to the supply station 40, timings of starting and stopping the drive of the loading mechanisms 53 and the belt conveyor units 27 and 47 are set as appropriate, and the setting can be changed as appropriate.

The first tray 2a is disposed on the supply station 40, the electronic component P is taken out from the first tray 2a with the suction head 153 of the component mounting apparatus 150, and the electronic component P taken out is mounted on the printed circuit board. FIGS. 9A to 9F are perspective views each showing a part of the conveyor 152 on which the supply station 40 and the printed circuit board 151 are placed at the time of the mounting process.

Figure 7A:
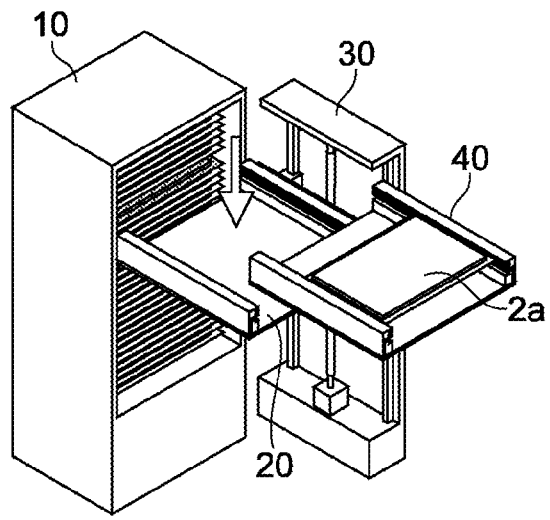
FIG. 7 are perspective views showing operations of the tray supply apparatus in sequence.
Figure 7B:
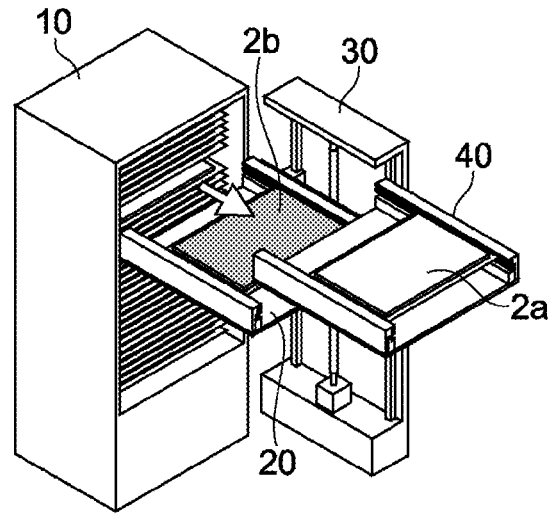
Figure 7C:
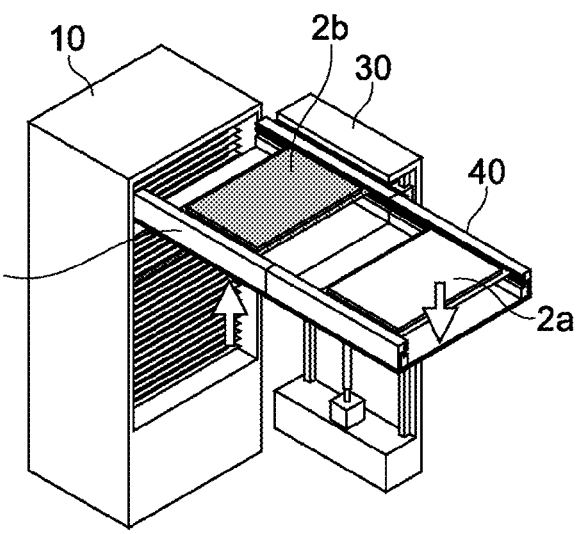

During the mounting process of the electronic component P, as shown in FIGS. 7A to 7C, the sub magazine 20 pulls out the next tray 2 (referred to as second tray 2b) from the tray magazine 10 and positioned to the height of the supply station 40, as in the same way shown in FIGS. 6A and 6B.

As shown in FIG. 7C, the first tray 2a is moved from the upper stage to the lower stage by the drive of the lifting and lowering stage 55. FIGS. 10A to 10D are schematic diagrams showing movement operations of the first tray 2a in sequence.

Figure 10A:
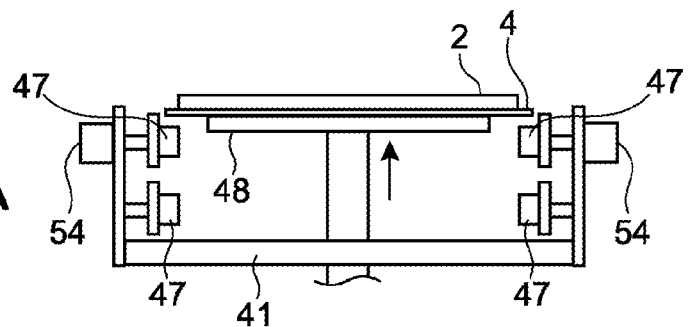
FIG. 10 are schematic diagrams showing movement operations in sequence in a vertical direction of a tray in the supply station.

As shown in FIG. 10A, by the drive of the lifting and lowering motor 49 of the lifting and lowering stage 55, the stage plate 48 is lifted, to support and hold up the palette 4 from the bottom, thereby separating the palette 4 upwards from the upper belt conveyor unit 47. In other words, the state in which the palette 4 is placed on the endless belts 44 (see, FIG. 4) is released.

Figure 10B:
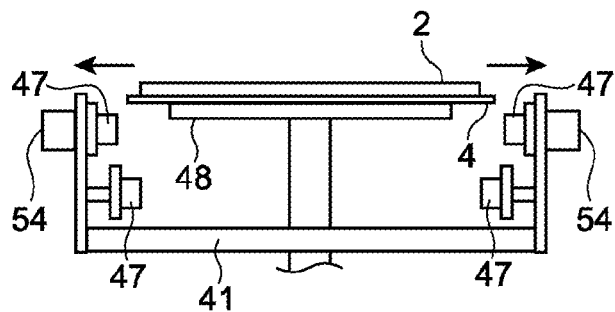
Figure 10C:
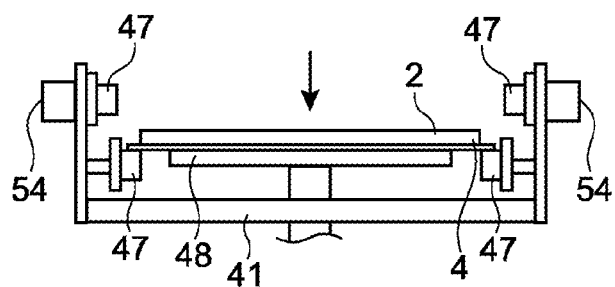

Next, as shown in FIG. 10B, by the drive of the opening and closing cylinder 54, the upper belt conveyor units 47 are evacuated to outside. Then, as shown in FIG. 10C, the stage plate 48 is lowered, thereby placing the palette 4 on the endless belts 44 of the lower belt conveyor units 47.

Figure 10D:
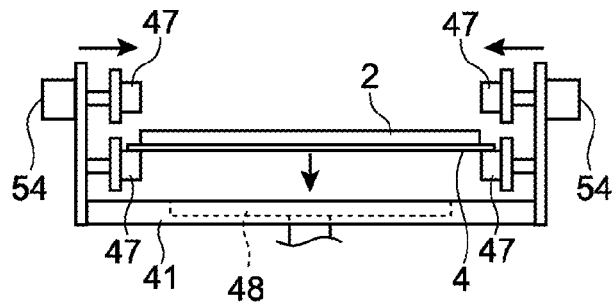

Then, as shown in FIG. 10D, the stage plate 48 is further lowered and buried in the base plate 41. That is, after the palette 4 is placed on the endless belts 44, the stage plate 48 releases the support of the palette 4. In addition, the upper belt conveyor units 47 are closed and returned to the original position. In this way, the first tray 2a is moved from the upper stage to the lower stage.

Figure 8A:
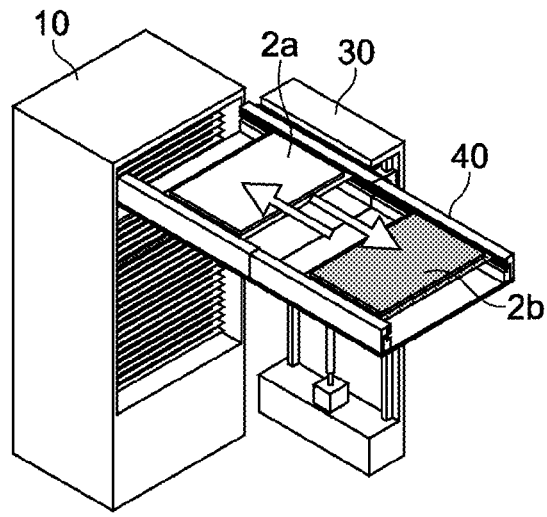
FIG. 8 are perspective views showing operations of the tray supply apparatus in sequence.

Subsequently, as shown in FIG. 8A, the positions of the first tray 2a and the second tray 2b are exchanged. In the supply station 40, as shown in FIG. 10D, the first tray 2a is disposed on the lower stage of the supply station 40, and the second tray 2b is disposed on the upper stage of the sub magazine 20. In this state, the lower belt conveyor units 47 of the supply station 40 and the upper belt conveyor units 27 of the sub magazine 20 are driven. As a result, the first tray 2a is moved to the lower belt conveyor units 27 of the sub magazine 20, and the second tray 2b is moved to the upper belt conveyor units 47 of the supply station 40. Then, as in the case of the first tray 2a, the electronic component P stored in the second tray 2b is mounted on the printed circuit board 151.

As described above, in this embodiment, the positions of the two trays 2 respectively disposed on the sub magazine 20 and the supply station 40 are exchanged substantially at the same time. Thus, the time efficiency of the supply of the tray 2 can be increased. The way of exchanging the trays 2 is not necessarily limited to the way in which the two trays 2 are simultaneously started to move and simultaneously stopped. It is only necessary to overlap the periods of time during which the two trays 2 are moved.

Figure 8B:
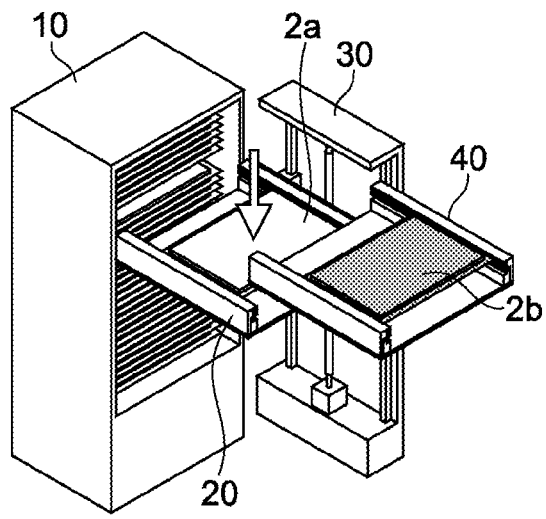
Figure 8C:
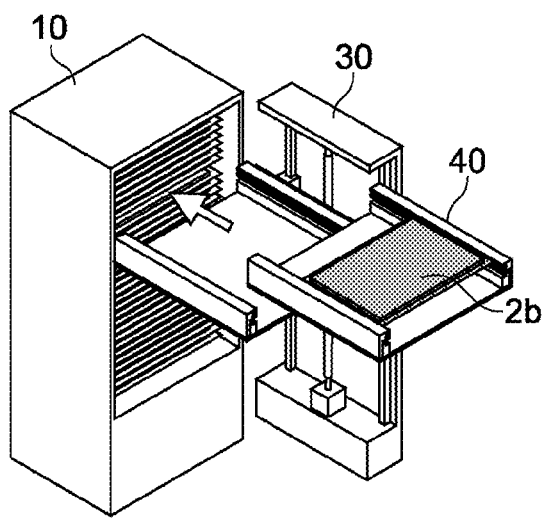
Figure 9A:
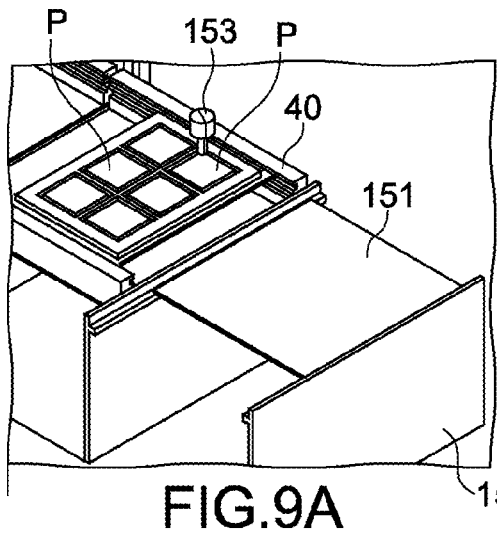
FIG. 9 are diagrams showing a part of a conveyor on which a supply station and a printed circuit board are mounted at a time of a component mounting process.
Figure 9B:
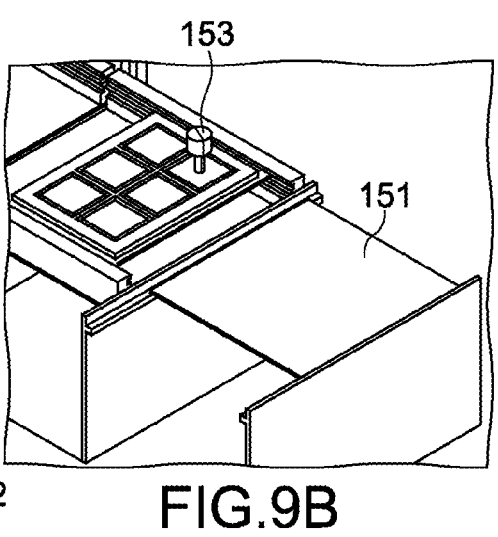
Figure 9C:
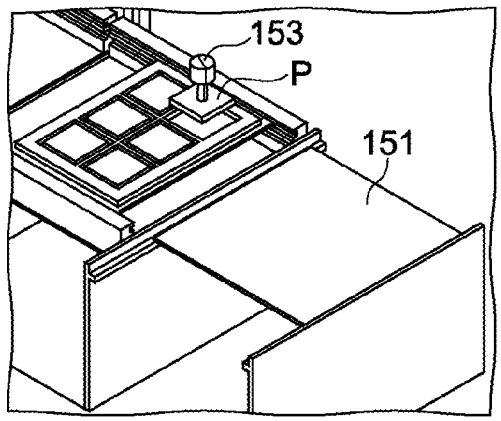
Figure 9D:
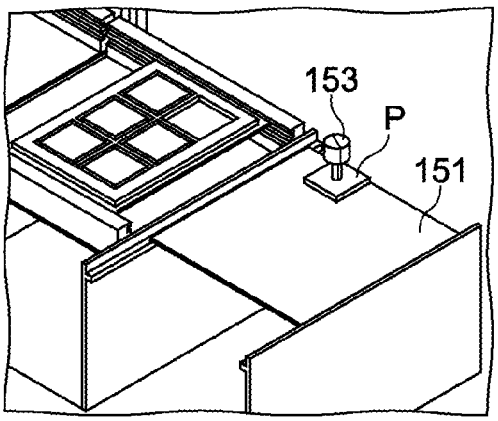
Figure 9E:
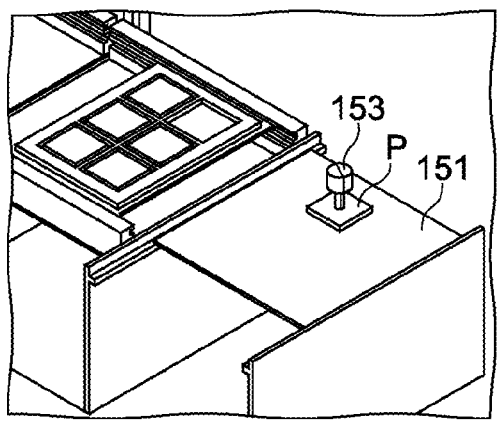
Figure 9F:
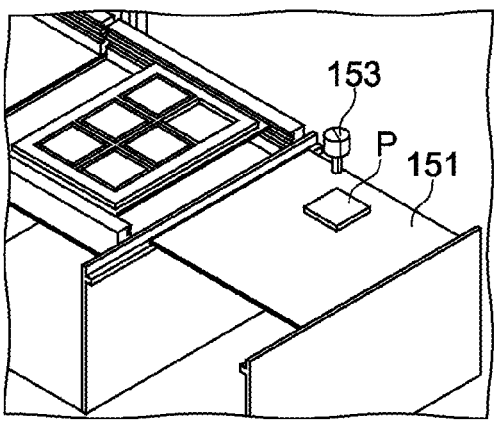

After the operation shown in FIG. 8A, during the mounting process of the electronic component P in the second tray 2b, the sub magazine 20 is generally positioned by the lifting and lowering mechanism 30 to the height at which the first tray 2a is originally stored in the tray magazine 10 as shown in FIG. 8B. In addition, as shown in FIG. 8C, by the drive of the belt conveyor units 27 of the sub magazine 20 and the loading mechanisms 53, the first tray 2a is stored at the originally stored position. Subsequently, the operations shown in FIGS. 6A to 6C are repeated.

In addition to the case where the first tray 2a is stored at the originally stored position, the time efficiency may be optimized by moving the first tray 2a from the sub magazine 20 to another storing position in the tray magazine 10 based on the control of the tray magazine control unit 3, for example.

FIGS. 11A to 11H are diagrams corresponding to the operations of the tray supply apparatus 100 after the operation shown in FIG. 8B. Correspondence relations thereof are as follows.

Figure 11A:
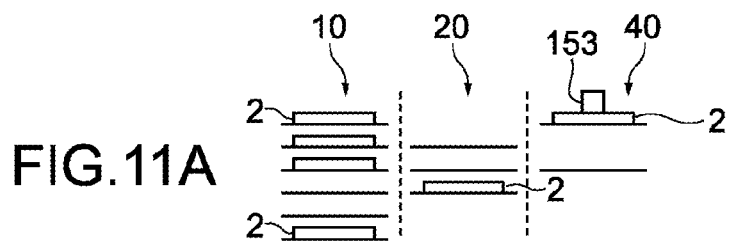
FIG. 11 are process diagrams schematically showing operations of the tray supply apparatus, which correspond to FIGS. 7 and 8.
Figure 11B:
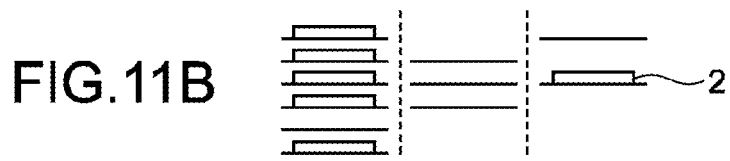
Figure 11C:
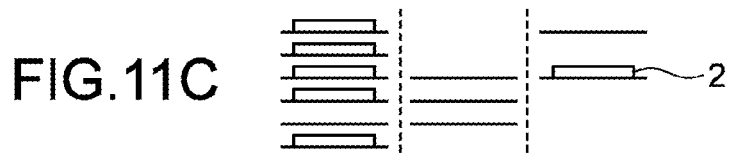
Figure 11D:
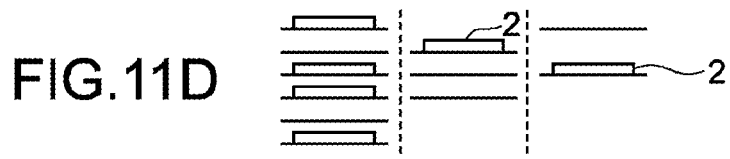
Figure 11E:
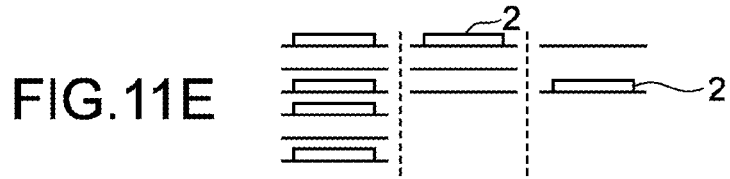
Figure 11F:
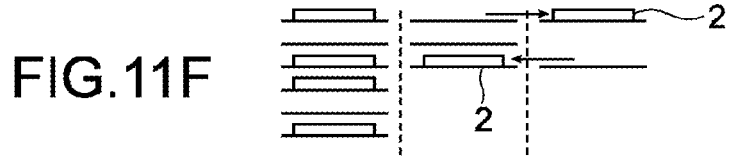
Figure 11G:
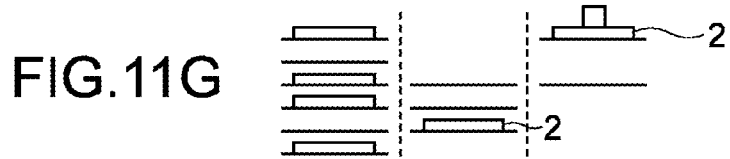
Figure 11H:
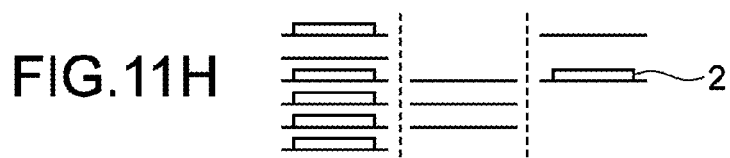
Figure 12A:
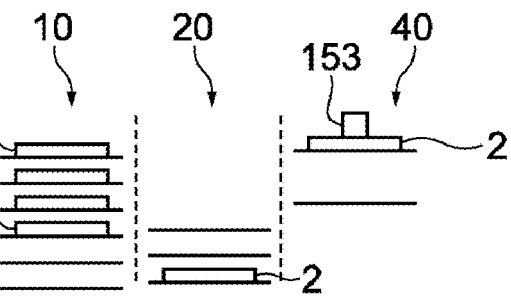
FIG. 12 are process diagrams schematically showing operations of the tray supply apparatus in a second embodiment.
Figure 12B:
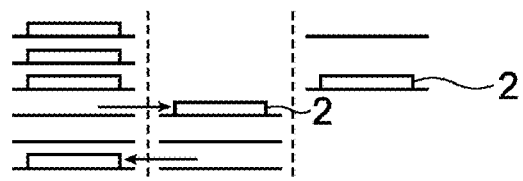
Figure 12C:
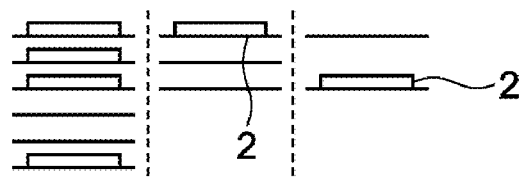
Figure 12D:
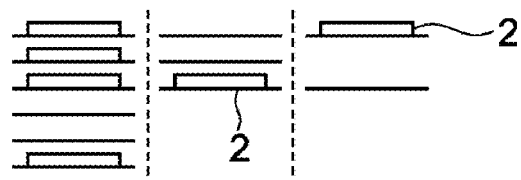
Figure 12E:
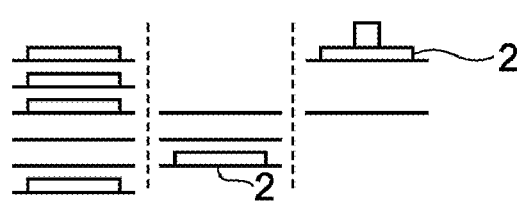
Figure 12F:
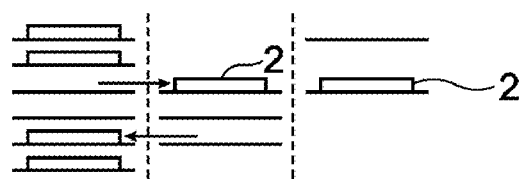

FIG. 11A corresponds to FIG. 8B.
FIGS. 11B and 11C correspond to FIG. 8C.
FIG. 11D corresponds to FIG. 7A.
FIG. 11E corresponds to FIG. 7B.
FIG. 11F corresponds to FIG. 8B.
FIGS. 11G and 11H correspond to FIG. 8C.

As can be seen from the process diagrams, FIGS. 11A to 11F show the processes necessary for supplying one tray 2 (six processes for each tray 2).

As described above, in this embodiment, the sub magazine 20 having the belt conveyor units 27 whose stages are fewer than the storing stages for the tray 2 stored in the tray magazine 10 is lifted and lowered by the lifting and lowering mechanism 30. As a result, unlike the related art, it is unnecessary to lift and lower a tray magazine 10 having a large capacity. Therefore, it is possible to avoid the increase in size of the tray magazine 10.

Further, the supply station 40 is provided with the lifting and lowering stage 55, and thus the tray 2 can be moved between the upper and lower belt conveyor units 47. That is, in the case where the tray 2 is conveyed between the tray magazine 10 and the belt conveyor units 27 and between the belt conveyor units 27 and 47, the drives of the lifting and lowering mechanism 30 and the lifting and lowering stage 55 are appropriately controlled so that a time-efficient conveyance path is set, with the result that the time efficiency of the supply of the tray 2 can be increased.

In particular, in this embodiment, the intervals for storing the trays 2 in the supply station 40 are set to be equal to the integral multiple (for example, twice) of the intervals for storing the trays 2 in the sub magazine 20. With this structure, the two trays 2 can be exchanged at the same time as described above, which can increase the time efficiency of the supply of the tray 2.

In addition, the trays 2 can be moved in the upper and lower stages of the supply station 40, with the result that other operations for increasing the conveyance time efficiency can be performed, in addition to the simultaneous exchange operation of the two trays 2. For example, the following operation can be performed.

On the upper stage of the supply station 40, the first tray 2a is disposed. During the mounting process, the second tray 2b is conveyed from the sub magazine 20 to the lower stage of the supply station 40. Thus, the two trays 2 are disposed on the upper and lower stages of the supply station 40. Then, a vacant sub magazine 20 that has no tray 2 pulls out a third tray from the tray magazine 10 to the lower stage thereof. After the mounting process of the electrical component P of the first tray is over, the first tray is moved to the upper stage of the sub magazine 20. The second tray disposed on the lower stage of the supply station 40 is moved to the vacant upper stage by using the lifting and lowering stage 55, and the mounting process of the electrical component P in the second tray is performed.

(Operations of Tray Supply Apparatus 100 According to Second Embodiment)

FIGS. 12A to 12F are process diagrams showing the operations of the tray supply apparatus 100 according to a second embodiment. The processes according to this embodiment are different from the processes shown in FIGS. 11A to 11H in that the tray 2 in the sub magazine 20 and the tray 2 in the tray magazine 10 are exchanged substantially at the same time in the processes shown in FIGS. 12B and 12F. Therefore, in the second embodiment, four processes are necessary for supplying one tray 2.

(Operations of Tray Supply Apparatus 100 According to Third Embodiment)

Figure 13A:
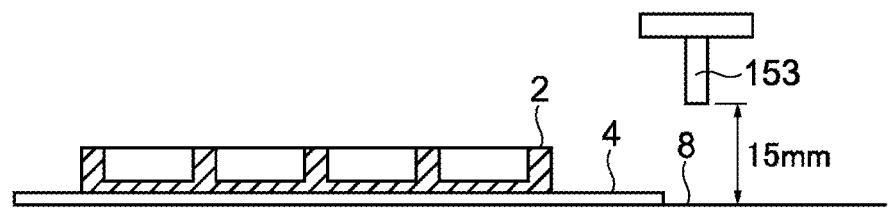
FIG. 13 are diagrams each showing a relationship between a stroke of a suction head and a thickness (height) of an electrical component for explaining operations of the tray supply apparatus in a third embodiment.

As shown in FIG. 13A, a stroke in the Z direction of the suction head 153 provided to the component mounting apparatus 150 is generally set to about 15 mm, for example. The stroke value is previously designed so that the thickness in the Z direction responds to a relatively thin electrical component P1. Generally, the stroke value is set as a distance from a lower end portion of the suction head 153 to a placement surface 8 on which the palette 4 is placed. The placement surface 8 corresponds to the surface of the endless belts 44 of the belt conveyor units 47 in the tray supply apparatus 100 according to this embodiment.

Figure 13B:
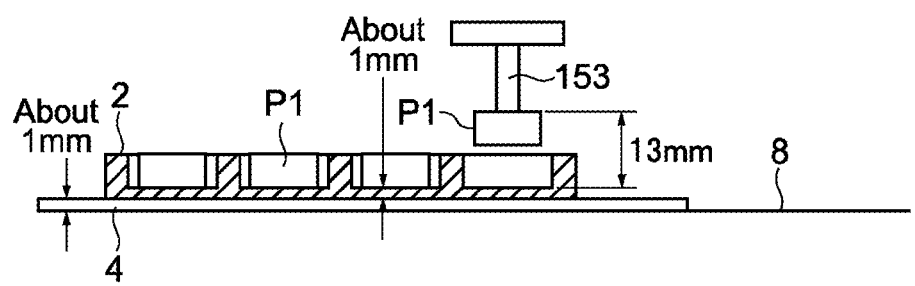

Here, as shown in FIG. 13B, when the thicknesses of the palette 4 and the tray 2 are set to about 1 mm, a stroke range becomes about 13 mm. In consideration of a margin of a height for avoiding an interference of the suction head 153 with the tray 2 or electrical component P1 at a time when the suction head 153 is horizontally moved, the thickness of the electrical component P1 in the tray 2 can be set to about 6 mm at a maximum.

Figure 14:
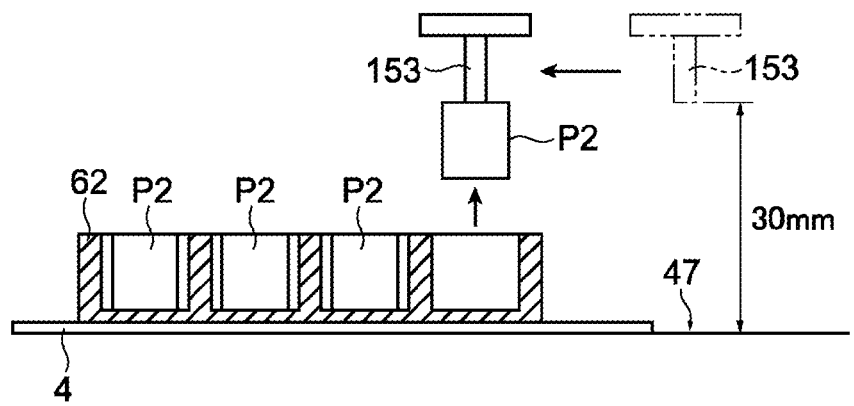
FIG. 14 is a diagram showing an example of a relatively thick electrical component.

As shown in FIG. 14, the tray supply apparatus 100 according to this embodiment can treat an electronic component P2 whose thickness is twice or more of the thickness of 6 mm. The supply station 40 places a tray 62 in which the electronic components P2 are stored on the lower belt conveyor units 47, thereby making it possible to give a longer distance from the lower end portion of the suction head 153 to the upper surface of the electronic components P2. In this case, the distance from the lower end portion of the suction head 153 to the lower surface of the palette 4 can be set to about 30 mm.

Figure 15:
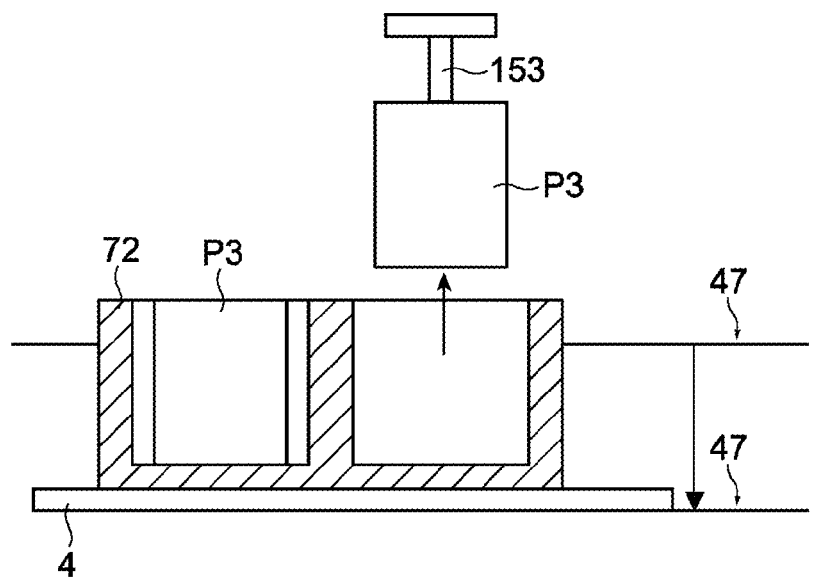
FIG. 15 is a diagram showing an example of a further thick electrical component.

In particular, in the supply station 40 according to this embodiment, the interval between the belt conveyor units 47 on the upper and lower stages is twice the storing interval of the tray magazine 10. Therefore, as shown in FIG. 15, thicker electronic components P3 stored in a higher tray 72 can be treated.

To implement the operations of this embodiment as described above, the sub magazine 20 may initially place the tray 62 or 72 on the lower stage of the supply station 40. Alternatively, in a case where the tray 62 or 72 is initially placed on the upper stage of the supply station 40, the lifting and lowering stage 55 may place the tray 62 or 72 on the lower stage.

The embodiments according to the present invention are not limited to those described above, and other embodiments can be variously conceived.

Instead of the conveyor units 27 and 47 using the belt drive, a conveyor unit using a ball screw drive, a rack and pinion drive, or a linear motor drive may be provided. The linear motor drive in this case refers to a non-contact type drive using a magnetic field.

In the above embodiments, in the sub magazine 20 (and the supply station 40), the set of the belt conveyor units 27 on both sides thereof in the X direction is driven to convey the one tray 2. Instead, the conveyor unit on only one side in the X direction may be used. This mode can be applied to a conveyor unit using the ball screw drive, the rack and pinion drive, or the linear motor drive.

Instead of the belt conveyor units 47 of the supply station 40, a placement portion having no drive source, on which the tray 2 can be placed, may be provided. In this case, the placement portion has a plurality of stages as in the case of the belt conveyor units 47. In addition, one placement portion only has to have a plurality of rotatable rollers arranged in the Y direction, for example.

In the above embodiments, the intervals in the Z direction of the belt conveyor units 27 (and the loading mechanisms 53) of the sub magazine 20 are corresponded to the storing intervals in the Z direction for the trays 2 stored in the tray magazine 10. However, the intervals in the Z direction of the belt conveyor units 27 (and the loading mechanisms 53) may be set to be equal to the integral multiple (twice or more) of the storing intervals of the tray magazine 10.

The intervals of the belt conveyor units 47 of the supply station 40 in the Z direction may be equal to those of the sub magazine 20.

The sub magazine 20 may convey the tray 2 by using the belt conveyor units 27 on the middle stage thereof. Alternatively, the sub magazine 20 may convey the tray 2 by using any two sets of the belt conveyor units 27 out of the belt conveyor units 27 on the upper, middle, and lower stages.

The sub magazine 20 may pull out two trays 2 from the tray magazine 10 substantially at the same time by using, for example, two sets out of the three sets of the belt conveyor units 27.

In order to enhance the accuracy for positioning the trays 2 on the belt conveyor units 27 and 47 in the sub magazine 20 and the supply station 40, respectively, the following embodiment may be considered. For example, a sensor that detects the position of the tray 2 on the belt conveyor units 27 (or 47) may be provided to the sub magazine 20 (or the supply station 40). As the sensor, an optical sensor, a magnetic sensor, or the like may be used.

Instead of the mode in which the sensor is used, for example, a stopper that stops the movement of the tray 2 or the palette 4 when the tray 2 is positioned at a desired position on the belt conveyor units 27 (or 47) may be provided. The stopper can be driven by a cylinder or other mechanisms.

In addition, a sensor for detecting whether the tray 2 and the palette 4 are present may be provided between the sub magazine 20 and the supply station 40. As the sensor, an optical sensor or other sensors may be used. When the sensor detects that the tray 2 and the palette 4 are not present, the lifting and lowering mechanism 30 drives the sub magazine 20. As a result, the sub magazine can be safely lifted and lowered, and the tray 2 can be safely conveyed.

The present application contains subject matter related to that disclosed in Japanese Priority Patent Application JP 2009-091713 filed in the Japan Patent Office on Apr. 6, 2009, the entire content of which is hereby incorporated by reference.

What is claimed is:

1. A tray supply apparatus, comprising:
   a tray magazine capable of storing a tray on each of a plurality of stages, the tray configured for storing components thereon;
   a sub magazine including a plurality of conveyance mechanisms having a plurality of stages, the sub magazine being adjacent to the tray magazine and being capable of taking out the tray from the tray magazine from any selected stage thereof, the plurality of conveyance mechanisms each conveying the tray;
   a supply station including a plurality of placement portions having a plurality of stages, on each of which the tray can be placed, and a stage that lifts and lowers the tray between the plurality of placement portions, the supply station being disposed at a position where the components stored in the tray are picked up; and
   a lifting and lowering mechanism to lift and lower the sub magazine relative to the stages of the tray magazine and the supply station to convey the tray between the selected stage of the tray magazine and the supply station through the sub magazine.

2. The tray supply apparatus according to claim 1, further comprising a control means for controlling drive of the lifting and lowering mechanism so that a height of at least one of the plurality of conveyance mechanisms is set to be equal to a height of at least one of the plurality of placement portions.

3. The tray supply apparatus according to claim 2, wherein one of an interval of the plurality of placement portions and a storing interval for the tray in the tray magazine is set to an integer multiple of an interval of the plurality of conveyance mechanisms.

4. The tray supply apparatus according to claim 3, further comprising a conveyance control means for controlling drives of first and second conveyance mechanisms out of the plurality of conveyance mechanisms so that a time period during which the tray is moved from a first placement portion out of the plurality of placement portions to the sub magazine by the first conveyance mechanism is overlapped with a time period during which the tray is moved from the sub magazine to a second placement portion out of the plurality of placement portions by the second conveyance mechanism, the first conveyance mechanism being positioned at a height corresponding to a height of the first placement portion.

5. The tray supply apparatus according to claim 1, wherein the supply station includes:
   a placement portion movement mechanism to move the placement portion to cause the placement portion to place the tray and release the placement of the tray, and
   means for controlling the stage and the placement portion movement mechanism so that, when the tray is moved from a first placement portion to a second placement portion out of the plurality of placement portions, the stage is caused to support the tray, the placement portion movement mechanism is caused to release the placement of the tray on the first placement portion and place the tray on the second placement portion, and the support of the tray by the stage is released.

6. The tray supply apparatus according to claim 1, wherein the conveyance mechanism is a belt conveyor unit that moves the tray placed thereon.

7. The tray supply apparatus according to claim 1, wherein the placement portion is a belt conveyor unit that moves the tray placed thereon.

8. The tray supply apparatus according to claim 1, further comprising means for controlling a height of the stage in accordance with the components having different heights.

\* \* \* \* \*